US011101406B2

(12) United States Patent
Huang et al.

(10) Patent No.: US 11,101,406 B2
(45) Date of Patent: Aug. 24, 2021

(54) EFFICIENT WIDE BANDGAP GAN-BASED LED CHIP BASED ON SURFACE PLASMON EFFECT AND MANUFACTURING METHOD THEREFOR

(71) Applicant: SOUTH CHINA UNIVERSITY OF TECHNOLOGY, Guangdong (CN)

(72) Inventors: Huamao Huang, Guangdong (CN); Hong Wang, Guangdong (CN); Xiaolong Hu, Guangdong (CN); Zhuobo Yang, Guangdong (CN); Rulian Wen, Guangdong (CN); Wei Shi, Guangdong (CN)

(73) Assignee: SOUTH CHINA UNIVERSITY OF TECHNOLOGY, Guangdong (CN)

(*) Notice: Subject to any disclaimer, the term of this patent is extended or adjusted under 35 U.S.C. 154(b) by 44 days.

(21) Appl. No.: 16/485,426

(22) PCT Filed: Dec. 25, 2016

(86) PCT No.: PCT/CN2016/111963
§ 371 (c)(1),
(2) Date: Aug. 12, 2019

(87) PCT Pub. No.: WO2018/112985
PCT Pub. Date: Jun. 28, 2018

(65) Prior Publication Data
US 2020/0006596 A1    Jan. 2, 2020

(30) Foreign Application Priority Data
Dec. 23, 2016  (CN) .......................... 201611209700.7

(51) Int. Cl.
*H01L 33/22*    (2010.01)
*H01L 33/00*    (2010.01)
(Continued)

(52) U.S. Cl.
CPC .......... *H01L 33/22* (2013.01); *H01L 33/0075* (2013.01); *H01L 33/06* (2013.01);
(Continued)

(58) Field of Classification Search
CPC ..... H01L 33/32; H01L 33/22; H01L 33/0075; H01L 33/06; H01L 33/382; H01L 33/46;
(Continued)

(56) References Cited

U.S. PATENT DOCUMENTS 8,080,480 B2 * 12/2011 Lee .................... H01L 21/30617
                                                         438/753
10,461,218 B2 * 10/2019 Koo ...................... H01L 33/382
(Continued)

FOREIGN PATENT DOCUMENTS

CN           1655371         8/2005
CN         101859861        10/2010
(Continued)

OTHER PUBLICATIONS

"International Search Report (Form PCT/ISA/210) of PCT/CN2016/111963," dated Aug. 30, 2017, with English translation thereof, pp. 1-4.

*Primary Examiner* — Stephen W Smoot
*Assistant Examiner* — Sun Mi Kim King
(74) *Attorney, Agent, or Firm* — JCIPRNET

(57) ABSTRACT

An efficient wide bandgap GaN-based LED chip based on a surface plasmon effect and a manufacturing method therefor. The efficient wide bandgap GaN-based LED chip is of a flip-chip structure, and comprises, from bottom to top in sequence, a substrate, a buffer layer, an unintentionally doped GaN layer, an n-GaN layer, a quantum well layer, an electron blocking layer, a p-GaN layer, a metallic reflecting mirror layer, a passivation layer, a p-electrode layer, an n-electrode layer; and a position of a bottom surface of the
(Continued)

metallic reflecting mirror layer connected to a surface of the p-GaN layer is provided with a micro-nano composite metal structure. A micro metal structure comprises alternating protrusion portions and recess portions; and a nano metal structure is distributed on an interface of the micro metal structure and the p-GaN layer.

9 Claims, 14 Drawing Sheets

(51) Int. Cl.
*H01L 33/06* (2010.01)
*H01L 33/32* (2010.01)
*H01L 33/38* (2010.01)
*H01L 33/46* (2010.01)

(52) U.S. Cl.
CPC ............ *H01L 33/32* (2013.01); *H01L 33/382* (2013.01); *H01L 33/46* (2013.01); *H01L 2933/0016* (2013.01); *H01L 2933/0025* (2013.01)

(58) Field of Classification Search
CPC ..... H01L 2933/0016; H01L 2933/0025; H01L 33/20; H01L 33/405; H01L 33/44; H01L 33/387; B82Y 40/00
See application file for complete search history.

(56) References Cited

U.S. PATENT DOCUMENTS

| | | | | |
|---|---|---|---|---|
| 2002/0121646 | A1* | 9/2002 | Khare | ............... H01L 21/02433 |
| | | | | 257/103 |
| 2007/0181889 | A1* | 8/2007 | Orita | ....................... H01L 33/46 |
| | | | | 257/79 |
| 2016/0372643 | A1* | 12/2016 | Kim | ......................... H01L 33/58 |

FOREIGN PATENT DOCUMENTS

| | | |
|---|---|---|
| CN | 103904183 | 7/2014 |
| CN | 204271120 | 4/2015 |
| JP | 2007049063 | 2/2007 |

\* cited by examiner

EFFICIENT WIDE BANDGAP GAN-BASED LED CHIP BASED ON SURFACE PLASMON EFFECT AND MANUFACTURING METHOD THEREFOR

CROSS-REFERENCE TO RELATED APPLICATION

This is a 371 application of the International PCT application serial no. PCT/CN2016/111963, filed on Dec. 25, 2016, which claims the priority benefits of China Application No. 201611209700.7, filed on Dec. 23, 2016. The entirety of each of the above-mentioned patent applications is hereby incorporated by reference herein and made a part of this specification.

TECHNICAL FIELD

The present invention relates to the field of GaN-based light-emitting diode (LED) chips for visible light communications, and more particularly, relates to an efficient wide bandgap GaN-based LED chip based on a surface plasmon (SP) effect and a manufacturing method therefor.

BACKGROUND

Visible light communications use a high-speed flashing LED as a signal source. When the flashing frequency of the LED exceeds the limit of a human eye response, the signal source can simultaneously serve as a light source in the fields of illumination, display, backlight, and the like. With the wide application of the LED in the above-mentioned fields, a LED chip having a high luminous efficiency and a high modulation bandwidth, as well as dual functions of the light source and the signal source, has become a research hotspot.

The modulation bandwidth of the LED chip is mainly affected by a recombination lifetime of a minority carrier in an active region and a RC bandwidth, wherein R and C are an equivalent resistance and an equivalent capacitance of the chip respectively. It has been proposed in literatures that doping in a barrier layer of a quantum well (QW) enables a space charge field to shield a piezoelectric field, so that the electron-hole wave function coupling is enhanced, and the recombination lifetime of the minority carrier is reduced. Other studies show that the recombination lifetime of the minority carrier can also be reduced by increasing a hole concentration, decreasing an active layer thickness and increasing an injection current density. However, all these methods will reduce the luminous efficiency of the chip, and a structure and a growth process of an epitaxial layer also need to be changed. From the perspective of chip manufacturing, in order to increase the modulation bandwidth of the LED, one solution is to reduce an effective luminous area of the chip. For example, a current confined aperture is used to limit a current injection path to a certain range, or a micro size chip is manufactured, thereby reducing the equivalent capacitance. Although this solution ensures the luminous efficiency of the chip, a luminous power is decreased due to the reduction of the effective luminous area.

A surface plasmon (SP) technology can significantly enhance a spontaneous emission rate of the minority carriers while increasing a luminous efficiency and a modulation bandwidth of a device. The LED chip is injected with electrons and holes through electrodes, and two carriers recombine in a light-emitting layer to generate excitons. One part of exciton energy emits photons by a radiative transition process, while the other part of exciton energy is lost by a non-radiative transition process such as lattice vibration and deep energy level impurity transition. If there are metal films or particles near the QW (the QW is located in a range of a SP evanescent field), the radiative transition process and the non-radiative transition process of the excitons compete with a QW-SP coupling process. When a frequency of the exciton is matched with a resonance frequency of the SP, a rate of coupling the exciton energy to a SP mode is much higher than those of the other two attenuation processes, thus reducing the recombination lifetime of the minority carrier and improving the modulation bandwidth.

SUMMARY

The present invention provides an efficient wide bandgap GaN-based LED chip based on a surface plasmon (SP) effect and a manufacturing method therefor with respect to GaN-based LED chips for visible light communications.

According to the efficient wide bandgap GaN-based LED chip based on a SP effect of the present invention, a micro-nano composite metal structure is manufactured on a surface of a p-GaN layer of a LED chip.

The present invention is achieved by the following technical solutions.

An efficient GaN-based LED chip based on a SP effect is of a flip-chip structure, and comprises, from bottom to top in sequence, a substrate, a buffer layer, an unintentionally doped GaN layer, an n-GaN layer, a quantum well layer, an electron blocking layer, a p-GaN layer, a metallic reflecting mirror layer, a passivation layer, a p-electrode layer and an n-electrode layer; and a position of a bottom surface of the metallic reflecting mirror layer connected to a surface of the p-GaN layer is provided with a micro-nano composite metal structure.

Further, the micro-nano composite metal structure comprises a micro metal structure and a nano metal structure; and the surface of p-GaN layer is provided with a micro-nano composite structure complementary to the micro-nano composite metal structure.

Still further, both the micro metal structure and the nano metal structure are in structures with alternating protrusion and recess.

Both an outer diameter and a height of the protrusion and an inner diameter and a depth of the recess of the micro metal structure are greater than a propagation length of a surface plasmon, ranging from 50 nm to 5 µm.

Still further, the nano metal structure is distributed on an interface of the micro metal structure and the p-GaN layer.

Still further, protrusion portions of the micro metal structure extend to a position 10 nm to 1 µm from a bottom of the p-GaN layer and close to the quantum well (QW) layer to realize effective SP-QW coupling; and recess portions of the micro metal structure cover the surface of the p-GaN layer, so that the p-GaN layer has a sufficient thickness for hole injection.

Still further, the protrusion and recess portions of the micro metal structure are distributed in space in one manner of random distribution, one-dimensional grating distribution, or two-dimensional lattice distribution, and a shape of the protrusion and an inner concave shape of the recess are both one of a cuboid, a cylinder, a truncated cone, a prism or a prism frustum.

Still further, protrusion and recess portions of the nano metal structure are distributed in space in one manner of random distribution, one-dimensional grating distribution, or two-dimensional lattice distribution, and a shape of the protrusion and an inner concave shape of the recess are both one of an irregular shape, a cuboid, a cylinder, a truncated cone, a prism or a prism frustum.

Further, a distance between the nano metal structure on the protrusion portion of the micro metal structure and the QW layer is smaller than a penetration depth of the surface plasmon in a chip medium, ranging from 10 nm to 200 nm.

A manufacturing method for any one of the efficient wide bandgap GaN-based LED chip based on a SP effect above comprises the following steps of:

(1) sequentially manufacturing the buffer layer, the unintentionally doped GaN layer, the n-GaN layer, the QW layer, the electron blocking layer, and the flat p-GaN layer on the substrate layer by layer; and manufacturing a mask structure in nanoscale on the surface of the flat p-GaN layer;

(2) copying a nano size pattern of the mask structure in nanoscale to the surface of the flat p-GaN layer by etching to manufacture the p-GaN layer having a nano size structure, and removing the remaining mask materials of the remaining mask structure in nanoscale;

(3) manufacturing a mask structure in microscale on the surface of the p-GaN layer having a nano size structure;

(4) copying a micron size pattern of the mask structure in microscale to the p-GaN layer having a nano size structure by etching to manufacture the p-GaN layer with the micro-nano composite structure distributed on the whole surface thereof, and removing the remaining mask materials of the remaining mask structure in microscale;

(5) manufacturing the metallic reflecting mirror layer on the surface of the p-GaN layer distributed with the micro-nano composite structure, and distributing a p-electrode metal hole and an n-electrode metal hole in the metallic reflecting mirror layer;

(6) extending to the n-GaN layer through etching at the n-electrode metal hole to form an n-electrode step;

(7) manufacturing the passivation layer on a surface of the metallic reflecting mirror layer, and distributing a p-electrode dielectric hole and an n-electrode dielectric hole in the passivation layer; and (8) manufacturing the p-electrode layer and the n-electrode layer on a surface of the passivation layer.

Further, in the steps (1), (2), (3) and (4), after manufacturing the mask structure in nanoscale on the surface of the flat p-GaN layer (7), the mask structure in microscale is directly manufactured on the surface of the mask structure in nanoscale, the p-GaN layer having a micro-nano composite structure is manufactured by one-time etching, and a protrusion surface of the p-GaN layer having a micro-nano composite structure does not have a nano structure thereon.

Further, in the steps (1), (2), (3) and (4), the p-GaN layer having a micron size structure is firstly manufactured on the surface of the flat p-GaN layer by etching the mask structure in microscale; and then the p-GaN layer having a micro-nano composite structure distributed on the whole surface thereof is manufactured by etching the mask structure in nanoscale on the surface of the p-GaN layer having a micron size structure.

Further, in the steps (1), (2), (3) and (4), the p-GaN layer having a micron size structure is firstly manufactured on the surface of the flat p-GaN layer by etching the mask structure in microscale; and then the mask structure in nanoscale is manufactured on the surface of the p-GaN layer having a micron size structure, and the metallic reflecting mirror layer is directly manufactured on the surface of the mask structure in nanoscale.

Further, the manufacturing the mask structure in nanoscale comprises the following steps of:

(1) manufacturing a thin film on the surface of the p-GaN layer; and (2) sequentially using a photolithography technology and a dry etching technology to manufacture a pattern in nanoscale on the thin film to obtain the mask structure in nanoscale.

Still further, in the step (1), a material of the thin film is one of $SiO_2$, SiN, $Al_2O_3$ or metal.

Still further, in the step (2), the photolithography technology comprises one of a projection photolithography technology, a deep-ultraviolet photolithography technology, a laser interference photolithography technology, a nanoimprint lithography or an electron beam lithography.

Still further, in the step (2), the dry etching technology comprises one of reactive ion etching (RIE), inductively coupled plasma etching (ICP) or focused ion beam etching.

Preferably, the manufacturing the mask structure in nanoscale on the surface of the flat p-GaN layer or the surface of the p-GaN layer having a micron size structure comprises the following steps of:

(1) adding tiny spheres in nanoscale into a solvent to prepare a tiny-sphere solution with a mass fraction of 0.5% to 10%, and uniformly dispersing the tiny spheres in the solution, (2) slowly dropwise adding the tiny-sphere solution into the deionized water with a calm liquid level along an inner wall of a container to completely diffuse the tiny spheres on the liquid level; and dropwise adding a surfactant on the liquid level, so that the tiny spheres form a single-layer compact tiny-sphere film stably floating on the liquid level; and (3) dipping the flat p-GaN layer or the p-GaN layer having a micron size structure into the liquid level, which is slowly moved towards the tiny-sphere film after being contacted with the tiny-sphere film, and pulled upwardly at an angle of 30° to 60°, so that the tiny-sphere film is transferred from the liquid level to the surface of the flat p-GaN layer or the surface of the p-GaN layer having a micron size structure, and then the solvent is completely volatilized by standing.

More preferably, in the step (1), the tiny spheres are one of poly(propyl ethylene), $SiO_2$, $Al_2O_3$, metal or metal/$SiO_2$ core-shell particle.

More preferably, in the step (1), the solvent is one of deionized water, absolute ethyl alcohol or iso-propanol.

More preferably, in the step (1), the dispersing method is one of ultrasonic vibration or magnetic stirring.

More preferably, in the step (2), the surfactant is one of a sodium dodecyl sulfate solution, a sodium dodecylbenzene sulfonate solution, a sodium dioctylsulfosuccinate solution, a sodium glycocholate solution or a triethanolamine soap solution with a mass fraction of 0.5% to 10%.

Compared with the prior art, the present invention has the following advantages and beneficial effects.

(1) The efficient wide bandgap GaN-based LED chip of the present invention is of a flip-chip structure, and the flip-chip structure is beneficial to improve a working current density of the chip.

(2) The protrusion portions of the micro metal structure extend to the vicinity of the QW layer, so as to implement efficient SP-QW coupling.

(3) The recess portions of the micro metal structure cover the surface of the p-GaN layer, so that the p-GaN layer has a sufficient thickness for hole injection; and the micron size structure thus reduces the influence of plasma damage on device performances in a dry etching process.

(4) The nano metal structure is distributed on an interface of the micro metal structure and the p-GaN; moreover, the nano size structure results in smaller SP losses, and is beneficial to generate a local SP with higher efficiency, so that the luminous efficiency and the modulation bandwidth are further improved. Compared with a GaN-based LED chip without a micro-nano composite structure, the luminous efficiency can be improved by 50%, and the modulation bandwidth can be improved by 75%.

DETAILED DESCRIPTION

The concrete implementation of the invention is further described hereinafter with reference to the accompanying drawings, but the scope of implementation and protection of the invention is not limited thereto.

Figure 1A:
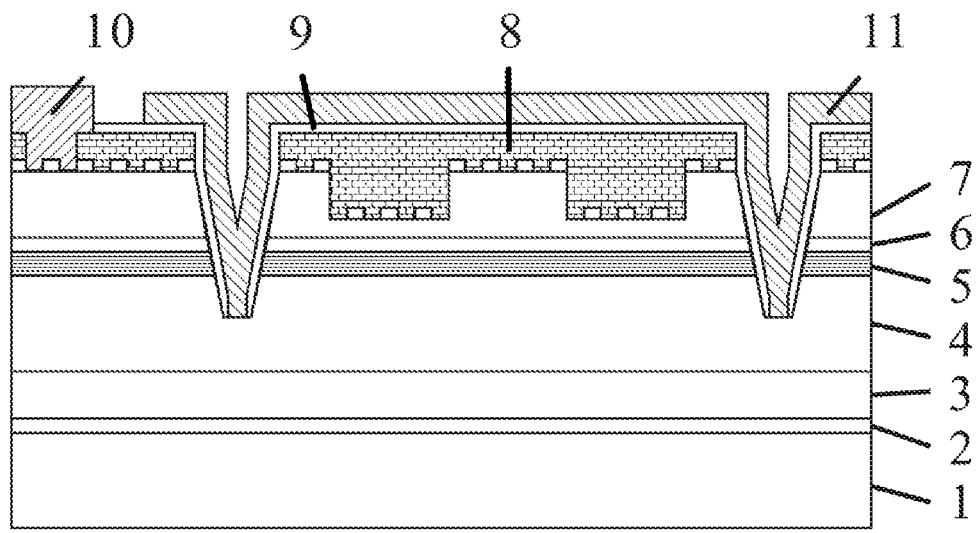
FIG. 1A shows a broadband efficient GaN-based LED chip based on a surface plasmon (SP) effect according to the present invention.

FIG. 1A shows an efficient wide bandgap GaN-based LED chip based on a surface plasmon (SP) effect according to the present invention, which is of a flip-chip structure, comprising from bottom to top in sequence, a substrate 1, a buffer layer 2, an unintentionally doped GaN layer 3, an n-GaN layer 4, a quantum well (QW) layer 5, an electron blocking layer 6, a p-GaN layer 7, a metallic reflecting mirror layer 8, a passivation layer 9, a p-electrode layer 10, and an n-electrode layer 11. A position of a bottom surface of the metallic reflecting mirror layer 8 connected to a surface of the p-GaN layer 7 is provided with a micro-nano composite metal structure.

The micro-nano composite metal structure comprises a micro metal structure and a nano metal structure. Both the micro metal structure and the nano metal structure are in structures with alternating protrusion and recess, and the nano metal structure is distributed on an interface of the micro metal structure and the p-GaN layer 7.

The surface of the p-GaN layer 7 is provided with a structure complementary to the micro-nano composite metal structure. Protrusion portions of the micro metal structure extend to a position 10 nm to 1 μm from a bottom of the p-GaN layer 7 and close to the QW layer 5, and recess portions of the micro metal structure cover the surface of the p-GaN layer 7.

Protrusion and recess portions of the micro metal structure are distributed in space in one manner of random distribution, one-dimensional grating distribution, or two-dimensional lattice distribution, and a shape of the protrusion and an inner concave shape of the recess are both one of a cuboid, a cylinder, a truncated cone, a prism or a prism frustum.

Protrusion and recess portions of the nano metal structure are distributed in space in one manner of random distribution, one-dimensional grating distribution, or two-dimensional lattice distribution, and a shape of the protrusion and an inner concave shape of the recess are both one of an irregular shape, a cuboid, a cylinder, a truncated cone, a prism or a prism frustum.

Both an outer diameter and a height of the protrusion and an inner diameter and a depth of the recess of the micro metal structure are greater than a propagation length of a surface plasmon, ranging from 50 nm to 5 μm. A distance between the nano metal structure on the protrusion portion of the micro metal structure and the QW layer 5 is smaller than a penetration depth of the surface plasmon in a chip medium, ranging from 10 nm to 200 nm.

Embodiment 1

An efficient wide bandgap GaN-based LED chip based on a SP effect is shown in

FIG. 1I.

A micro-nano composite structure is manufactured on a surface of a p-GaN in a LED chip of a flip-chip structure. A micro structure is a truncated cone with triangular lattice distribution, wherein the truncated cone has a lattice constant of 2 μm, an upper bottom diameter of 1.3 μm, and a lower bottom diameter of 1 μm. A nano structure is a cylinder with hexagonal lattice distribution on the whole surface of p-GaN, wherein the cylinder has a lattice constant of 100 nm, and a height and a diameter of 50 nm both. A distance from a bottom of the cylinder located in a recess of the micro structure to a top of a QW 5 is 10 nm. A metallic reflecting mirror layer 8 is manufactured on the p-GaN layer 7 to form a micro-nano composite metal structure.

A manufacturing process of the efficient wide bandgap GaN-based LED chip based on a SP effect is shown in FIG. 1B to FIG. 1I, and the steps are as follows.

(1) A buffer layer 2, an unintentionally doped GaN layer 3, an n-GaN layer 4, a QW layer 5, an electron blocking layer 6, and a flat p-GaN layer 7 are sequentially manufactured on a substrate 1 layer by layer. A SiO$_2$ layer having a thickness of 50 nm is manufactured on the surface of the p-GaN layer 7 using plasma enhanced chemical vapor deposition (PECVD).

Figure 1B:
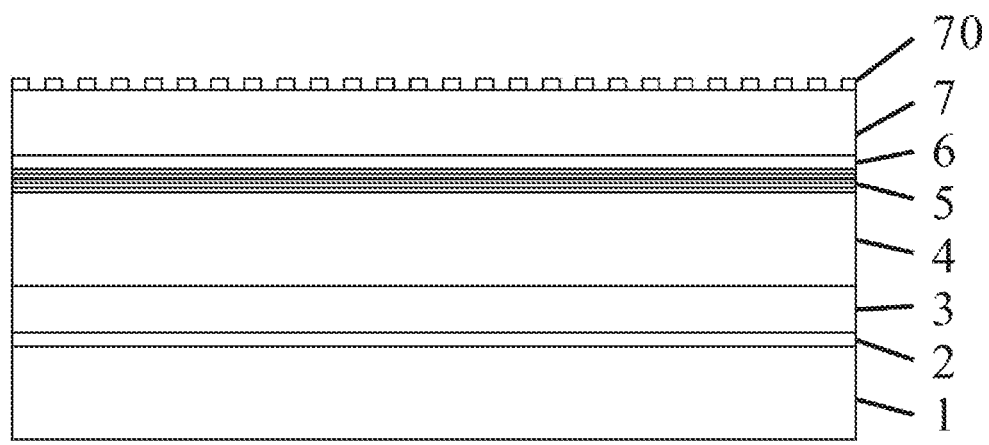
FIG. 1B is a schematic diagram of a mask structure in nanoscale manufactured in Embodiment 1.

(2) A nanoimprint lithography and an inductively coupled plasma (ICP) etching technology are used to manufacture the SiO$_2$ layer into a cylinder with hexagonal lattice distribution by using a nanoimprint resist as a mask, i.e. a mask structure 70 in nanoscale, wherein the cylinder has a lattice constant of 100 nm, a height of 50 nm and a diameter of 50 nm, as shown in FIG. 1B.

Figure 1C:
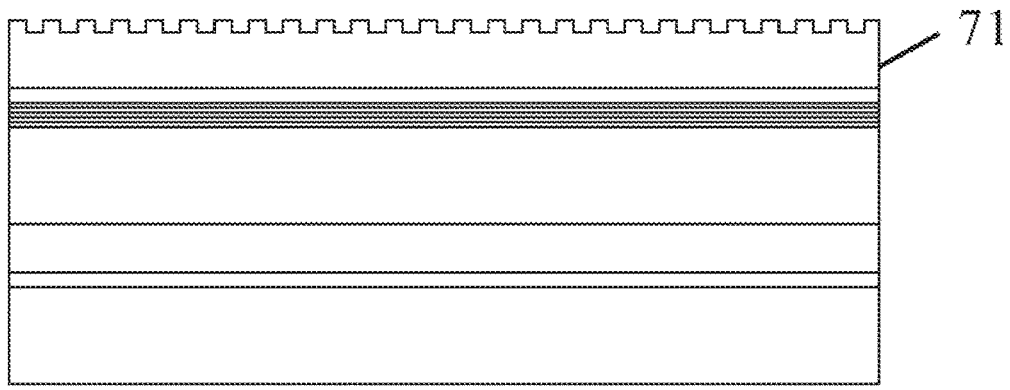
FIG. 1C is a schematic diagram of a p-GaN layer having a nano structure manufactured in Embodiment 1.

(3) An ICP etching technology is used to manufacture a cylinder with hexagonal lattice distribution on the surface of the p-GaN layer 7 by using a SiO$_2$ nano pattern as a mask structure, wherein the cylinder has a lattice constant of 100 nm, a height of 50 nm and a diameter of 50 nm. A p-GaN layer 71 having a SiO$_2$ nano cylinder structure is manufactured, as shown in FIG. 1C.

Figure 1D:
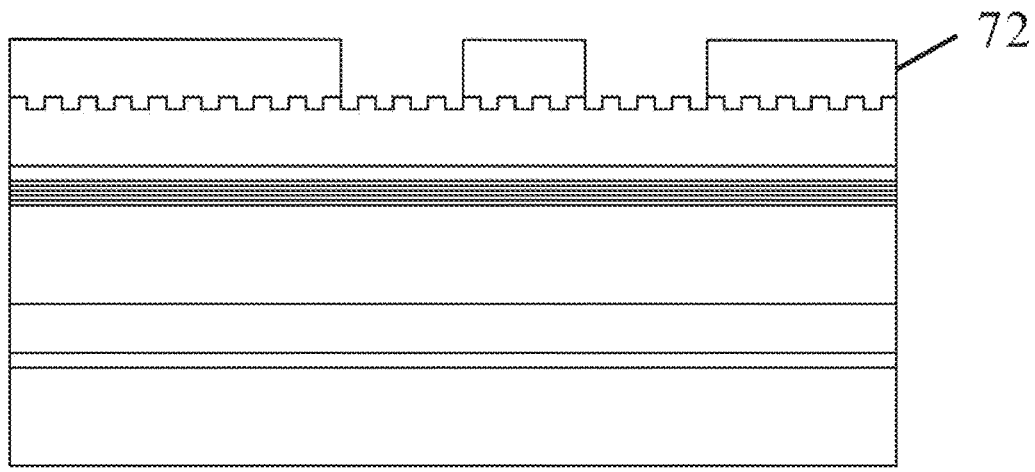
FIG. 1D is a schematic diagram of a mask structure in microscale manufactured in Embodiment 1.

(4) A projection photolithography technology is used to manufacture a cylinder with triangular lattice distribution on a photoresist, wherein the cylinder has a lattice constant of 2 μm, and a diameter of 1 μm. A photoresist mask structure 72 in microscale is manufactured on a surface of the p-GaN layer 71, as shown in FIG. 1D.

Figure 1E:
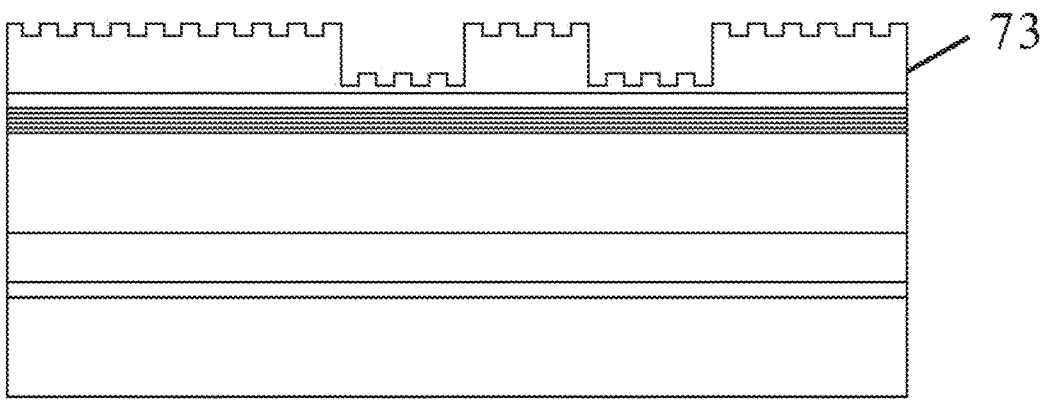
FIG. 1E is a schematic diagram of a p-GaN layer having a micro-nano composite structure manufactured in Embodiment 1.

(5) An ICP etching technology is used to etch the mask structure 72 to manufacture a truncated cone with triangular lattice distribution on the surface of the p-GaN layer, wherein the truncated cone has a lattice constant of 2 μm, an upper bottom diameter of 1.3 μm, and a lower bottom diameter of 1 μm. A distance from the lower bottom of the truncated cone to a top of a QW 5 is 10 nm. A p-GaN layer 73 having a micro-nano composite structure is manufactured, and the micro-nano composite structure is distributed on the whole surface of the p-GaN layer 73, as shown in FIG. 1E.

Figure 1F:
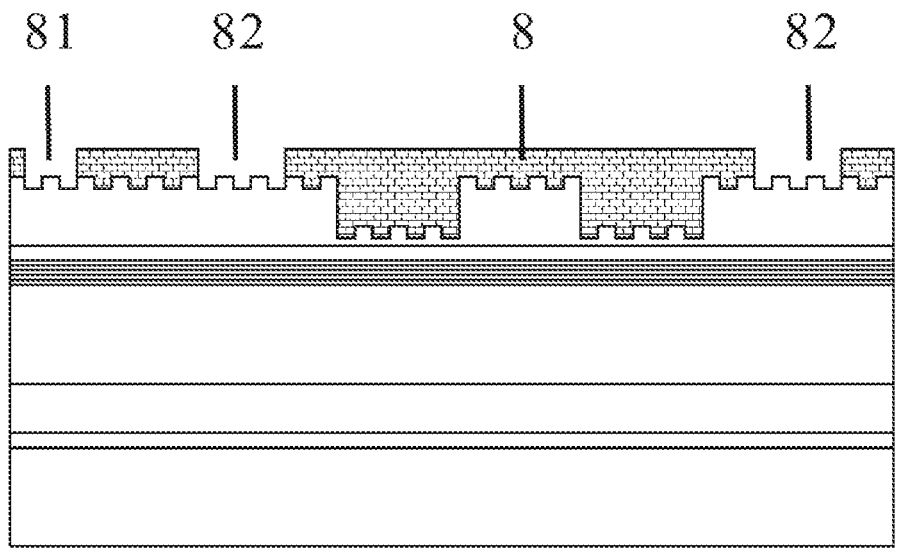
FIG. 1F is a schematic diagram of a metallic reflecting mirror layer manufactured in Embodiment 1.

(6) A Ni/Ag/Cr (1 nm/100 nm/100 nm) metallic reflecting mirror layer 8 is manufactured by using a metal lift-off technology and an electron beam evaporation technology. A micro-nano composite metal structure is formed on an interface of the metallic reflecting mirror layer 8 and the p-GaN layer 7, p-electrode metal holes 81 and n-electrode metal holes 82 are distributed in the metallic reflecting mirror layer 8, and a distance from a bottom of the nano metal structure to the top of the QW 5 is 10 nm, as shown in FIG. 1F.

Figure 1G:
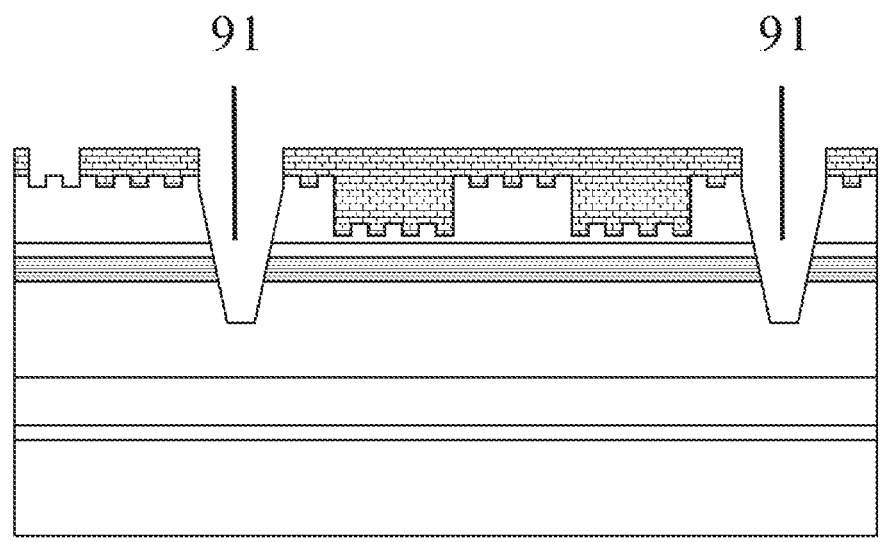
FIG. 1G is a schematic diagram of an n-electrode step manufactured in Embodiment 1.

(7) An ordinary ultraviolet photolithography technology and an ICP etching technology are used to form an n-electrode step 91 at the n-electrode metal holes 82, and the n-electrode step 91 extends to the n-GaN layer 4, as shown in FIG. 1G.

Figure 1H:
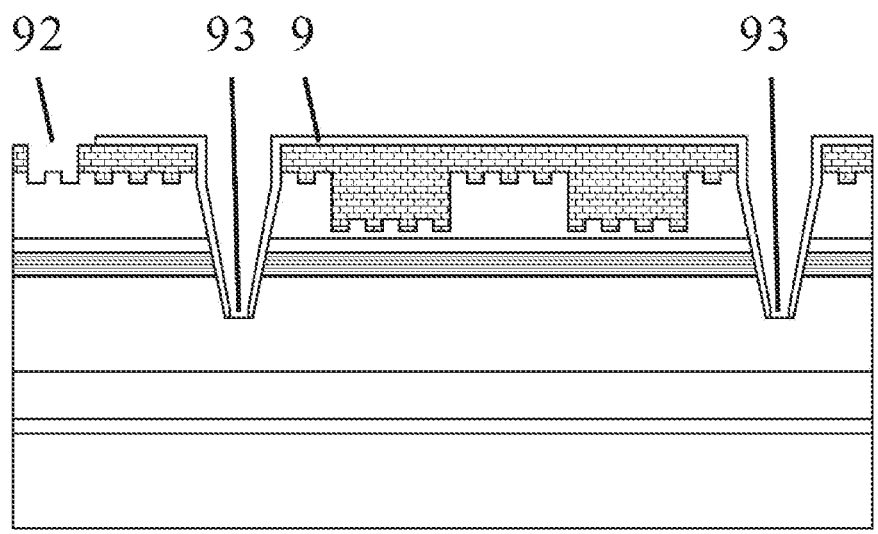
FIG. 1H is a schematic diagram of a passivation layer manufactured in Embodiment 1.

(8) A SiO$_2$ passivation layer 9 is manufactured on the surface of the metallic reflecting mirror layer 8 by using a PECVD, an ordinary ultraviolet photolithography technology and a reactive ion etching (RIE) technology, and p-electrode holes 92 and n-electrode holes 93 are distributed in the passivation layer 9, as shown in FIG. 1H.

Figure 1I:
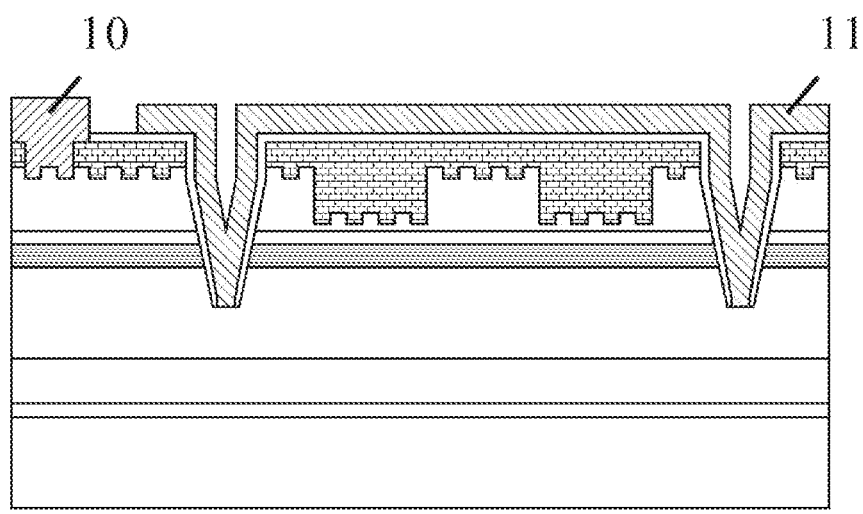
FIG. 1I is a schematic diagram of a p-electrode layer and an n-electrode layer manufactured in Embodiment 1.

(9) A Cr/Au (100 nm/200 nm) p-electrode layer 10 and a Cr/Au(100 nm/200 nm) n-electrode layer 11 are manufactured on the surface of the passivation layer 9 using a metal lift-off technology and an electron beam evaporation technology, as shown in FIG. 1I.

The efficient wide bandgap GaN-based LED chip based on a SP effect is obtained, which can generate a local SP with higher efficiency and results in small SP losses. Compared with a GaN-based LED chip without a micro-nano composite structure, the luminous efficiency can be improved by 50%, and the modulation bandwidth can be improved by 75%.

Embodiment 2

Figure 2A:
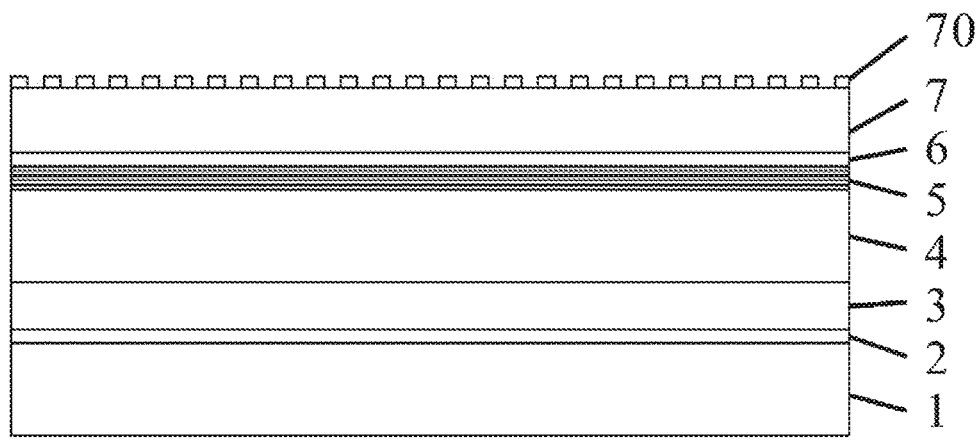
FIG. 2A is a schematic diagram of a mask structure in nanoscale manufactured in Embodiment 2.
Figure 2B:
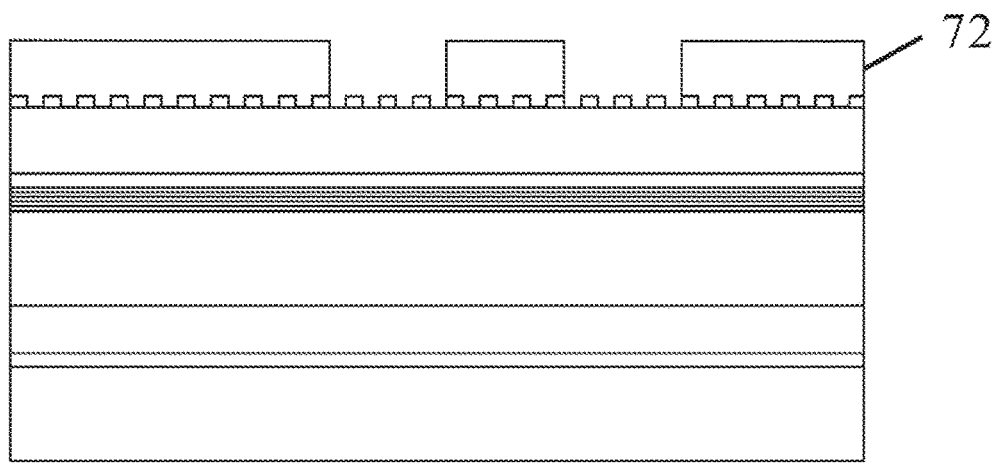
FIG. 2B is a schematic diagram of a mask structure in microscale manufactured in Embodiment 2.
Figure 2C:
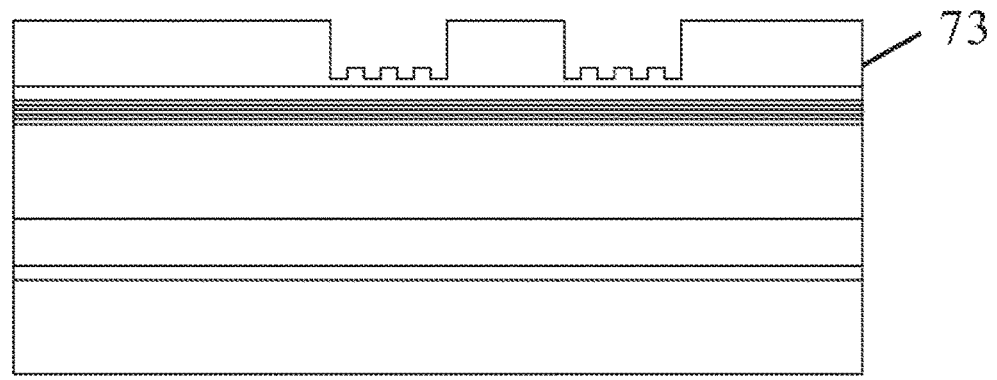
FIG. 2C is a schematic diagram of a p-GaN layer having a micro-nano composite structure manufactured in Embodiment 2.
Figure 2D:
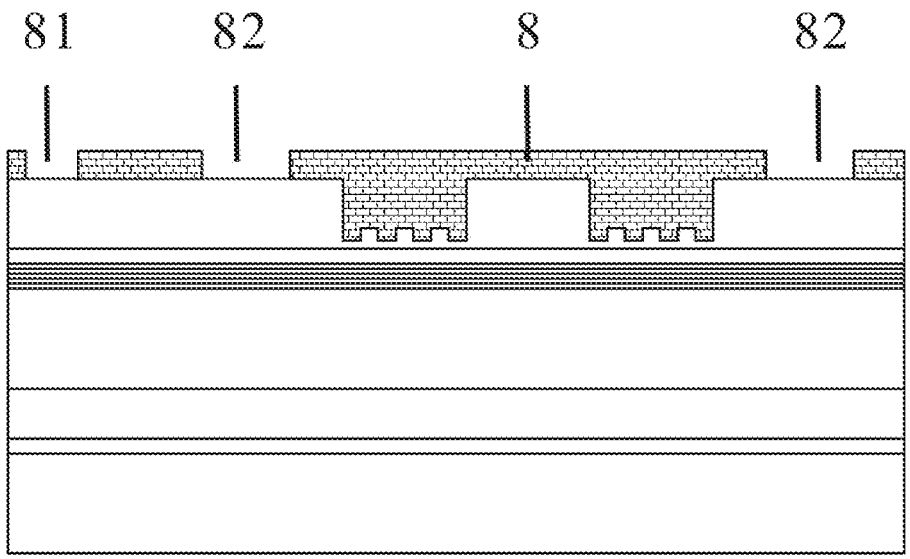
FIG. 2D is a schematic diagram of a metallic reflecting mirror layer manufactured in Embodiment 2.
Figure 2E:
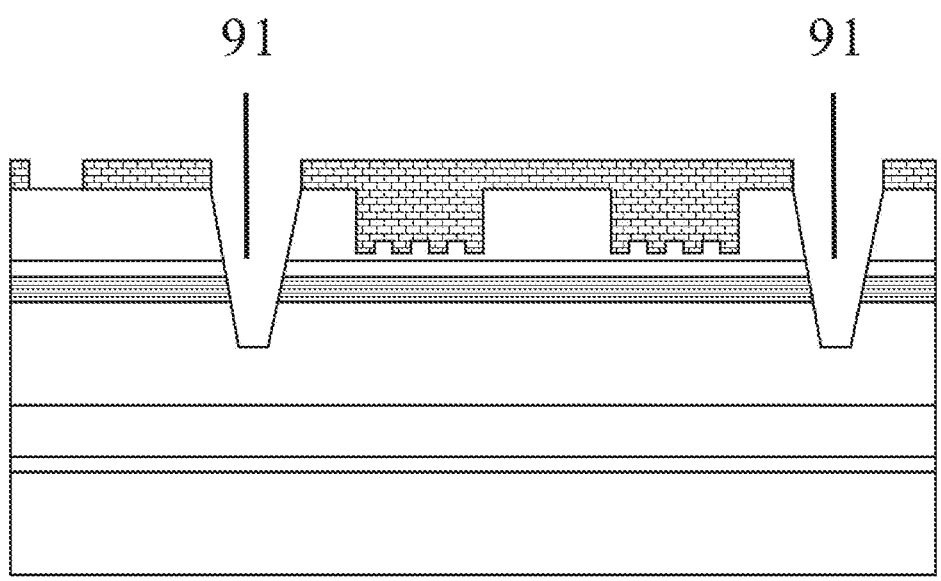
FIG. 2E is a schematic diagram of an n-electrode step manufactured in Embodiment 2.
Figure 2F:
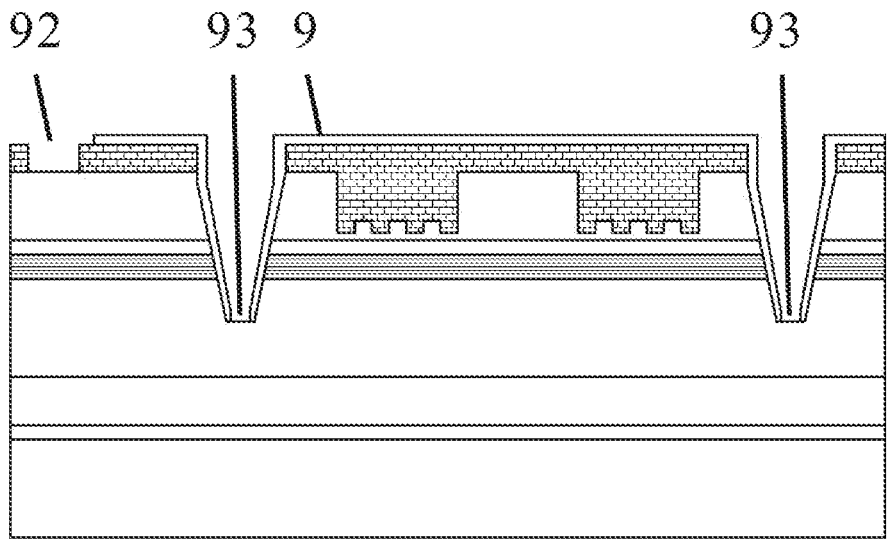
FIG. 2F is a schematic diagram of a passivation layer manufactured in Embodiment 2.
Figure 2G:
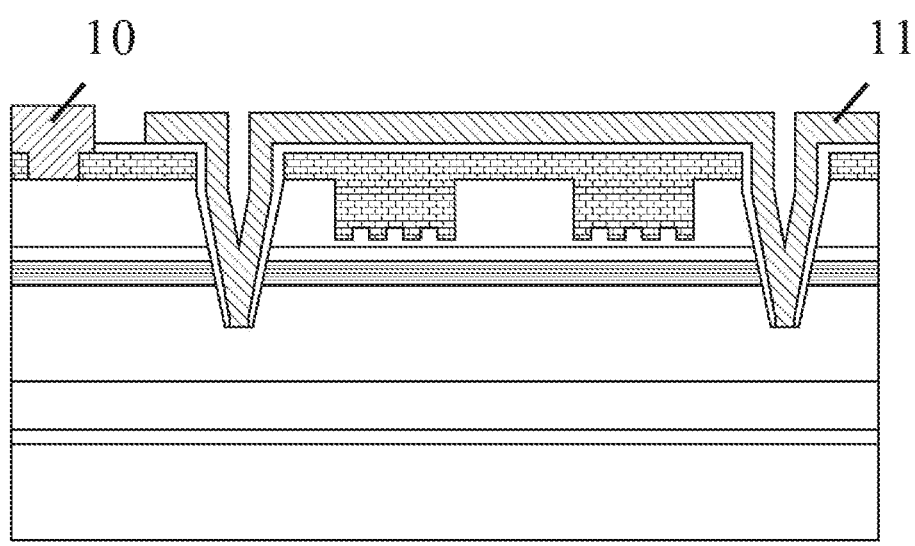
FIG. 2G is a schematic diagram of a p-electrode layer and an n-electrode layer manufactured in Embodiment 2.

An efficient wide bandgap GaN-based LED chip based on a SP effect is shown in FIG. 2G.

A micro-nano composite structure is manufactured on a surface of a p-GaN in a LED chip of a flip-chip structure. A micro structure is a one-dimensional grating, wherein the grating has a lattice constant of 3 μm, and a grating hole has an upper bottom diameter of 1.8 μm, and a lower bottom diameter of 1.5 μm. A distance from the lower bottom of the grating to a top of a QW 5 is 30 nm. A nano structure is located at a bottom of a recess of the micro structure and is of an irregular structure that is randomly distributed, wherein the irregular structure has a height and a width of 50 nm and a gap of 200 nm. A metallic reflecting mirror layer 8 is manufactured on the p-GaN layer 7 to form a micro-nano composite metal structure.

A manufacturing process of the efficient wide bandgap GaN-based LED chip based on a SP effect is shown in FIG. 2A to FIG. 2G, and the steps are as follows.

(1) A buffer layer 2, an unintentionally doped GaN layer 3, an n-GaN layer 4, a QW layer 5, an electron blocking layer 6, and a flat p-GaN layer 7 are sequentially manufactured on a substrate 1 layer by layer. A nickel metal film with a thickness of 2 nm is manufactured on the surface of the p-GaN layer 7 by magnetron sputtering. A sample is subjected to rapid thermal annealing at a heating rate of 20° C./s to agglomerate the nickel metal film to form nickel metal particles, wherein the nickel metal particles have a height and a width of 50 nm and a gap of 200 nm, i.e., a mask structure 70 in nanoscale, as shown in FIG. 2A.

(2) A photoresist is coated on a surface of the mask structure 70 by using a spraying technology, and a one-dimensional grating structure is manufactured on the photoresist by a laser interference photolithography technology, wherein the one-dimensional grating structure, i.e., the mask structure in microscale 72, has a lattice constant of 3 μm, and a grating hole has an upper bottom diameter of 1.8 μm and a lower bottom diameter of 1.5 μm, as shown in FIG. 2B.

(3) The mask structure in nanoscale 70 and the mask structure in microscale 72 form a composite mask structure, and a pattern of the composite mask structure is copied to the p-GaN layer 7 by ICP etching to manufacture a p-GaN layer 73 having a micro-nano composite structure, wherein the nano structure is distributed on a recess of the p-GaN layer 73, and has a height and a width of 50 nm and a gap of 200 nm, and a distance from a bottom of the nano structure to a top of the QW is 30 nm, as shown in FIG. 2C.

(4) A Cr/Al/Ti (2 nm/800 nm/50 nm) metallic reflecting mirror layer 8 is manufactured by using an electron beam evaporation technology, and a micro-nano composite metal structure is formed on an interface of the metallic reflecting mirror layer 8 and the p-GaN layer 7, and a distance from a bottom of the nano metal structure to the top of the QW is 30 nm. Ordinary ultraviolet photolithography technology and chemical wet etching technology are used to manufacture p-electrode metal holes 81 and n-electrode metal holes 82 in the metallic reflecting mirror layer 8, as shown in FIG. 2D.

(5) An ordinary ultraviolet photolithography technology and an ICP etching technology are used to form an n-electrode step 91 at the n-electrode metal holes 82, and the n-electrode step 91 extends to the n-GaN layer 4, as shown in FIG. 2E.

(6) A SiN passivation layer 9 is manufactured on the surface of the metallic reflecting mirror layer 8 by using a PECVD, an ordinary ultraviolet photolithography technology and a reactive ion etching (RIE) technology, and p-electrode holes 92 and n-electrode holes 93 are distributed in the passivation layer 9, as shown in FIG. 2F.

(7) A Ti/Au (50 nm/100 nm) p-electrode layer 10 and a Ti/Au (50 nm/100 nm) n-electrode layer 11 are manufactured on the surface of the passivation layer 9 by using a metal lift-off technology and an electron beam evaporation technology, as shown in FIG. 2G.

The efficient wide bandgap GaN-based LED chip based on a SP effect is obtained, which generates a local SP with higher efficiency and results in small SP losses. Compared with a GaN-based LED chip without a micro-nano composite structure, the luminous efficiency can be improved by about 50%, and the modulation bandwidth can be improved by about 75%.

Embodiment 3

Figure 3A:
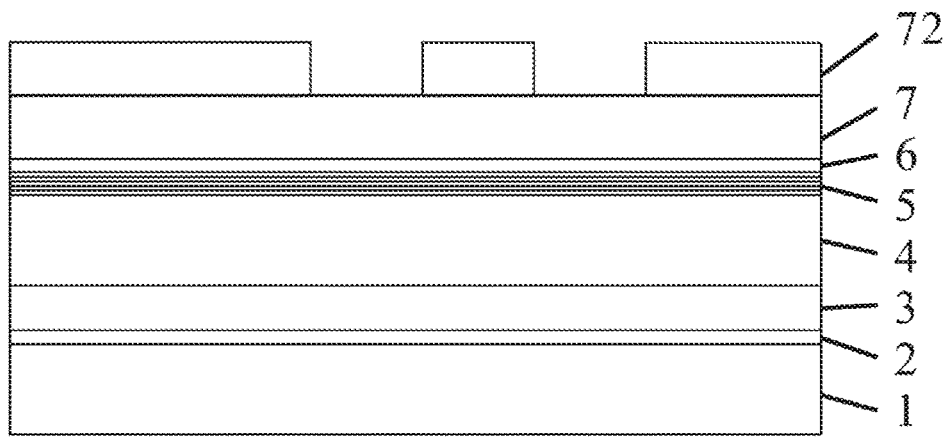
FIG. 3A is a schematic diagram of a mask structure in microscale manufactured in Embodiment 3.
Figure 3B:
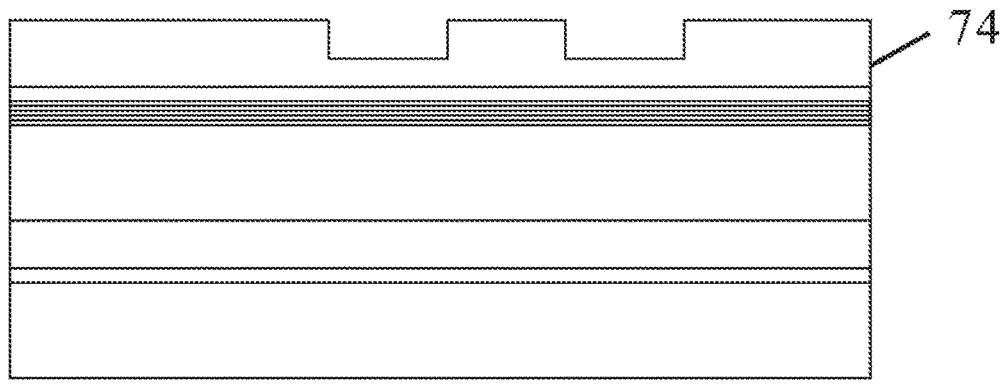
FIG. 3B is a schematic diagram of a p-GaN layer having a micro structure manufactured in Embodiment 3.
Figure 3C:
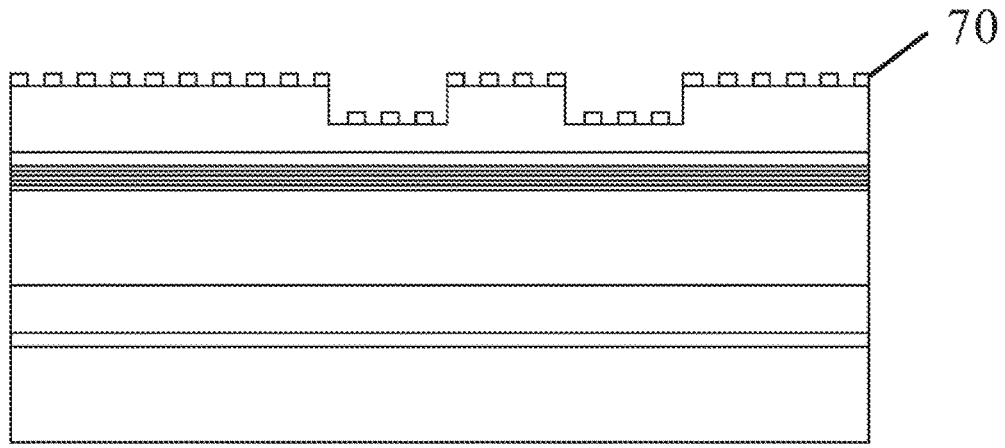
FIG. 3C is a schematic diagram of a mask structure in nanoscale manufactured in Embodiment 3.
Figure 3D:
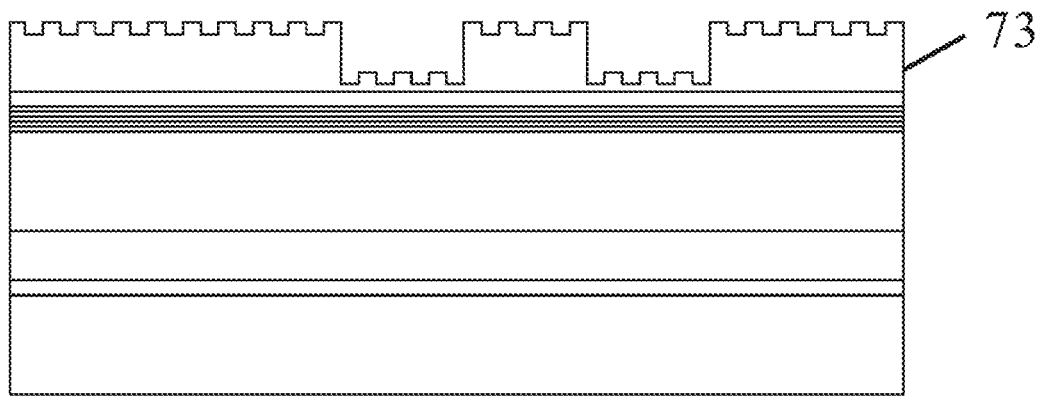
FIG. 3D is a schematic diagram of a p-GaN layer having a micro-nano composite structure manufactured in Embodiment 3.
Figure 3E:
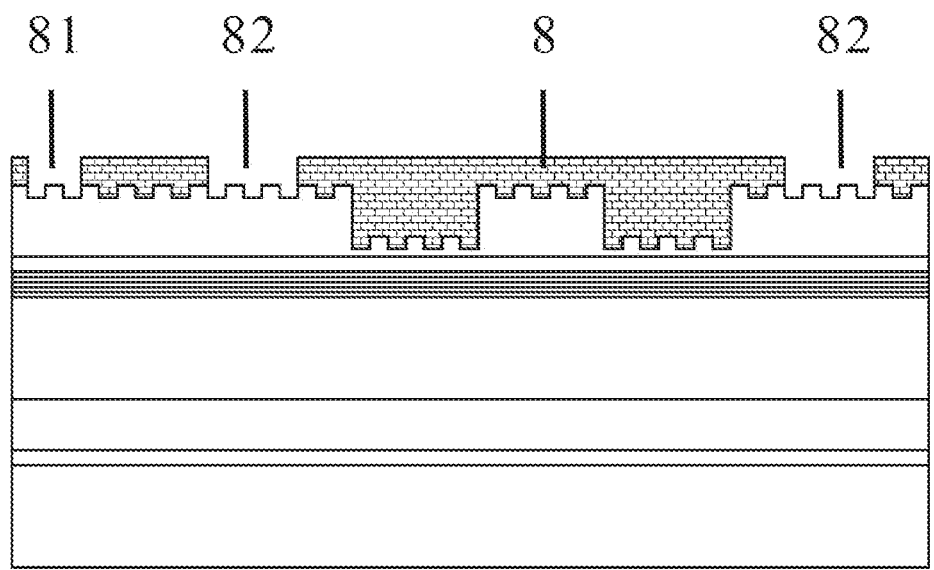
FIG. 3E is a schematic diagram of a metallic reflecting mirror layer manufactured in Embodiment 3.
Figure 3F:
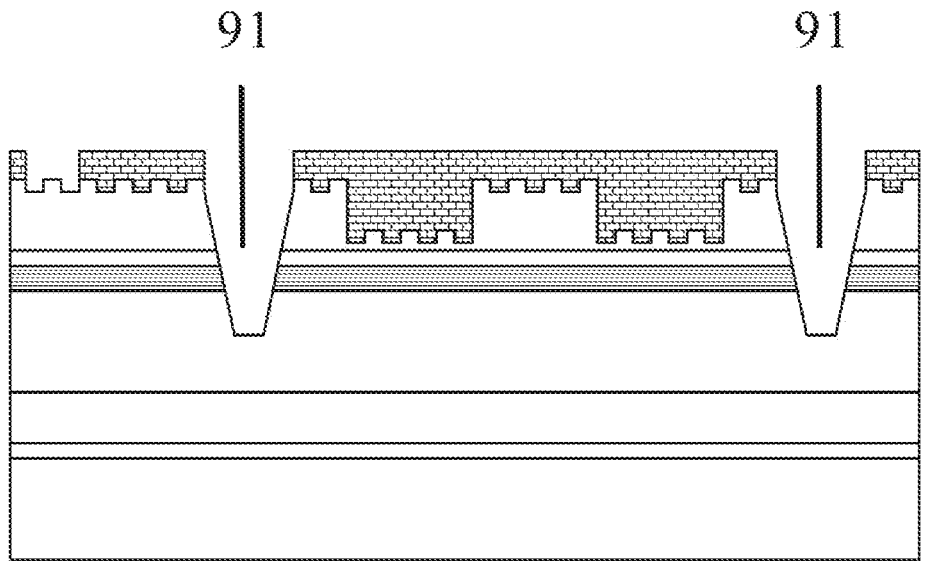
FIG. 3F is a schematic diagram of an n-electrode step manufactured in Embodiment 3.
Figure 3G:
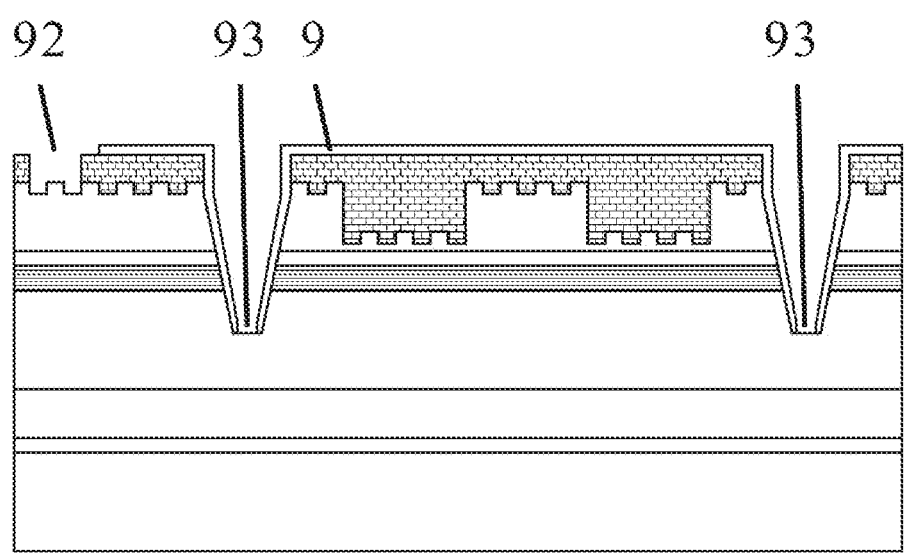
FIG. 3G is a schematic diagram of a passivation layer manufactured in Embodiment 3.
Figure 3H:
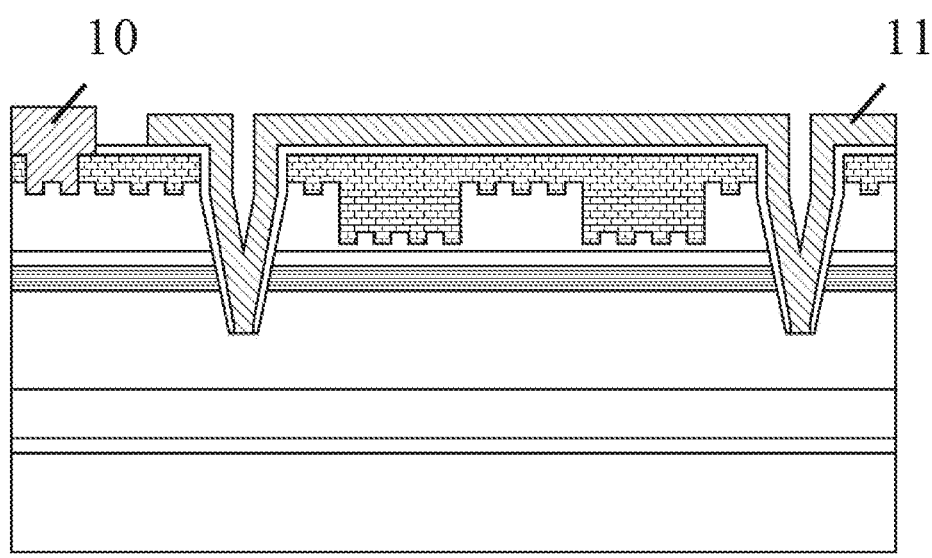
FIG. 3H is a schematic diagram of a p-electrode layer and an n-electrode layer manufactured in Embodiment 3.

An efficient wide bandgap GaN-based LED chip based on a SP effect is shown in FIG. 3H.

A micro-nano composite structure is manufactured on a surface of a p-GaN in a LED chip of a flip-chip structure. A micro structure is a cuboid with hexagonal lattice distribution, wherein the cuboid has a lattice constant of 4 µm, and a side length of 2 µm. A nano structure is a truncated cone with triangular lattice distribution distributed on the whole surface of the p-GaN, wherein the truncated cone has a lattice constant of 250 nm, and a height and a diameter of 125 nm both. A distance from a bottom of the truncated cone located in a recess of the micro structure to a top of a QW 5 is 40 nm. A metallic reflecting mirror layer 8 is manufactured on the p-GaN layer 7 to form a micro-nano composite metal structure.

A manufacturing process of the efficient wide bandgap GaN-based LED chip based on a SP effect is shown in FIG. 3A to FIG. 3H, and the manufacturing steps are as follows.

(1) A buffer layer 2, an unintentionally doped GaN layer 3, an n-GaN layer 4, a QW layer 5, an electron blocking layer 6, and a flat p-GaN layer 7 are sequentially manufactured on a substrate 1 layer by layer. An ordinary ultraviolet photolithography technology is used to manufacture a cuboid with hexagonal lattice distribution on a photoresist, i.e., a mask structure in microscale 72, wherein the cuboid has a lattice constant of 4 µm and a side length of 2 µm, as shown in FIG. 3A.

(2) An ICP etching technology is used to manufacture a cuboid with hexagonal lattice distribution on the surface of the p-GaN layer 7 by using the photoresist as a mask, wherein the cuboid has a lattice constant of 4 µm and a side length of 2 µm. A p-GaN layer 74 having a micron size structure is manufactured, as shown in FIG. 3B.

(3) An electron beam lithography technology is used to manufacture a truncated cone with triangular lattice distribution on a surface of the p-GaN layer 74 having a micron size structure, i.e., a mask structure in nanoscale 70, wherein the truncated cone has a lattice constant of 250 nm, and a height and a diameter of 125 nm, as shown in FIG. 3C.

(4) The mask structure in nanoscale 70 and the mask structure in microscale 72 form a composite mask structure, and a pattern of the composite mask structure is copied to the p-GaN layer 74 by ICP etching to manufacture a p-GaN layer 73 having a micro-nano composite structure, and the micro-nano composite structure is distributed on the whole surface of the p-GaN layer 73. A nano structure is a cylinder with hexagonal lattice distribution, wherein the cylinder has a lattice constant of 250 nm, and a height and a diameter of 125 nm both. A distance from a bottom of the truncated cone located in a recess of the micro structure to a top of a QW 5 is 40 nm, as shown in FIG. 3D.

(5) A Ti/Ag/Ni (4 nm/150 nm/100 nm) metallic reflecting minor layer 8 is manufactured by using a metal lift-off technology and an electron beam evaporation technology. A micro-nano composite metal structure is formed on an interface of the metallic reflecting mirror layer 8 and the p-GaN layer 7, p-electrode metal holes 81 and n-electrode metal holes 82 are distributed in the metallic reflecting mirror layer 8, and a distance from a bottom of the nano metal structure to the top of the QW is 50 nm, which is as shown in FIG. 3E.

(6) An ordinary ultraviolet photolithography technology and an ICP etching technology are used to form an n-electrode step 91 at the n-electrode metal holes 82, and the n-electrode step 91 extends to the n-GaN layer 4, as shown in FIG. 3F.

(7) A SiO$_2$ passivation layer 9 is manufactured on the surface of the metallic reflecting mirror layer 8 by using a PECVD, an ordinary ultraviolet photolithography technology and a reactive ion etching (RIE) technology, and p-electrode holes 92 and n-electrode holes 93 are distributed in the passivation layer 9, which are as shown in FIG. 3G.

(8) A Ni/Au (100 nm/400 nm) p-electrode layer 10 and a Ni/Au (100 nm/400 nm) n-electrode layer 11 are manufactured on the surface of the passivation layer 9 by using a metal lift-off technology and an electron beam evaporation technology, as shown in FIG. 3H.

The efficient wide bandgap GaN-based LED chip based on a SP effect is obtained, which generates a local SP with higher efficiency and results in small SP losses. Compared with a GaN-based LED chip without a micro-nano composite structure, the luminous efficiency can be improved by about 50%, and the modulation bandwidth can be improved by about 75%.

Embodiment 4

Figure 4A:
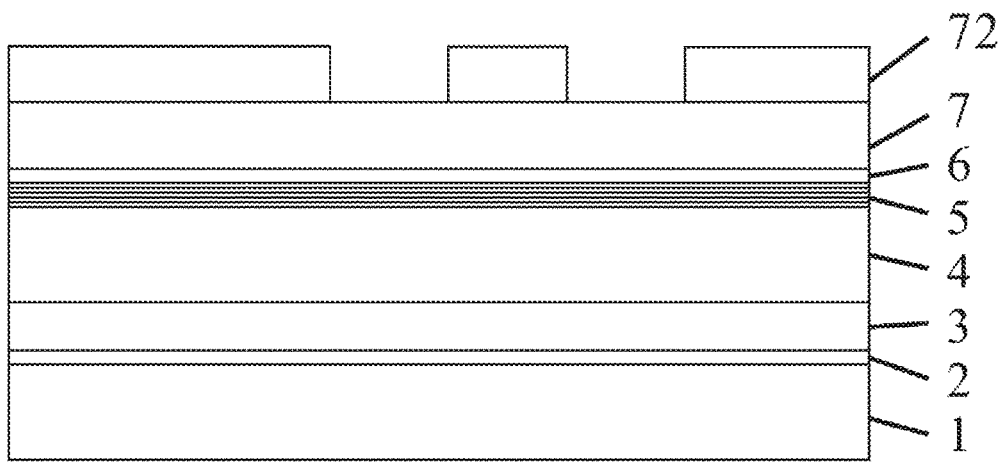
FIG. 4A is a schematic diagram of a mask structure in microscale manufactured in Embodiment 4.
Figure 4B:
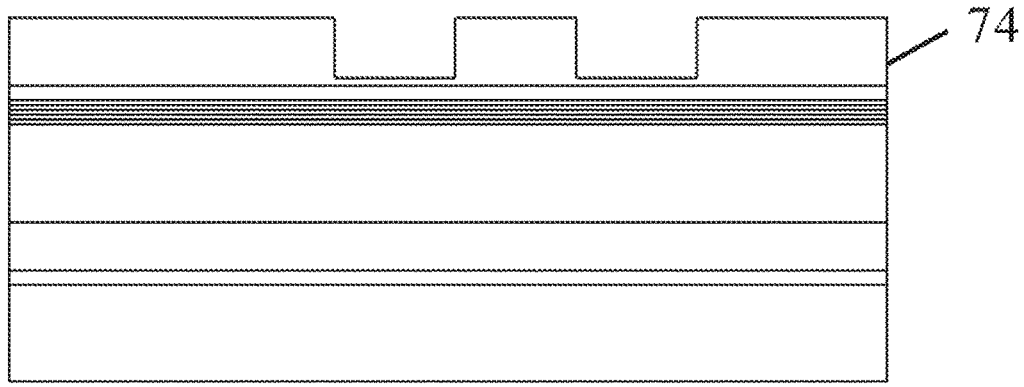
FIG. 4B is a schematic diagram of a p-GaN layer having a micro structure manufactured in Embodiment 4.
Figure 4C:
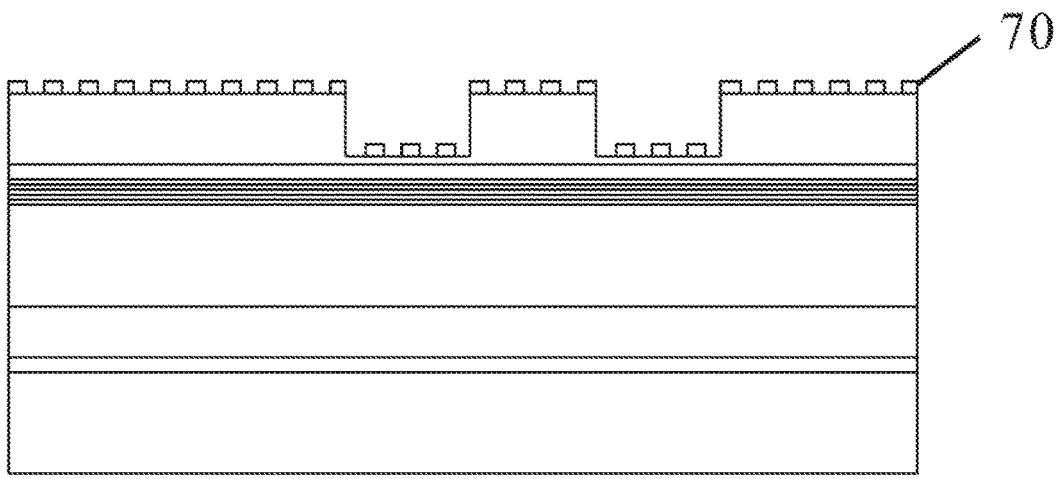
FIG. 4C is a schematic diagram of a mask structure in nanoscale manufactured in Embodiment 4.
Figure 4D:
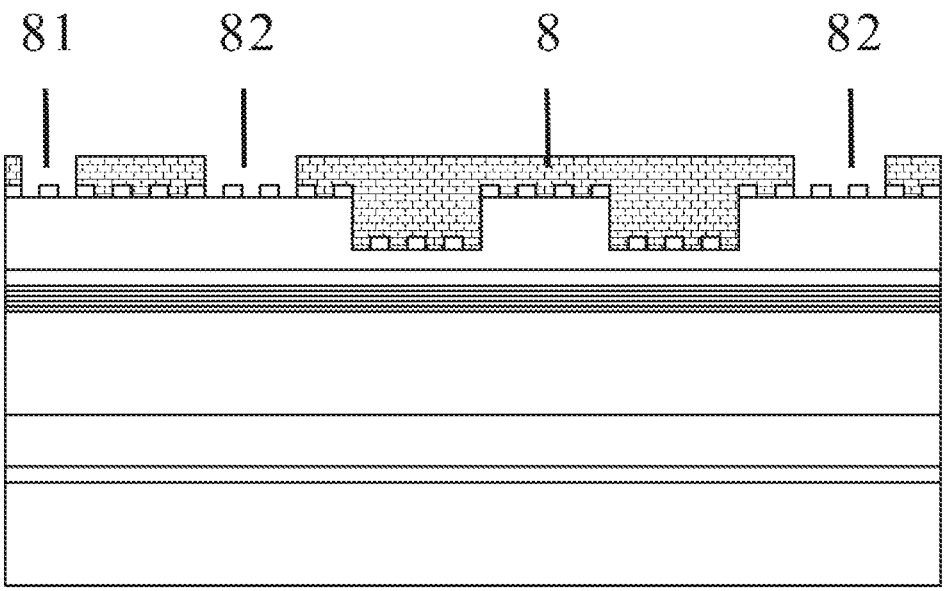
FIG. 4D is a schematic diagram of a metallic reflecting mirror layer manufactured in Embodiment 4.
Figure 4E:
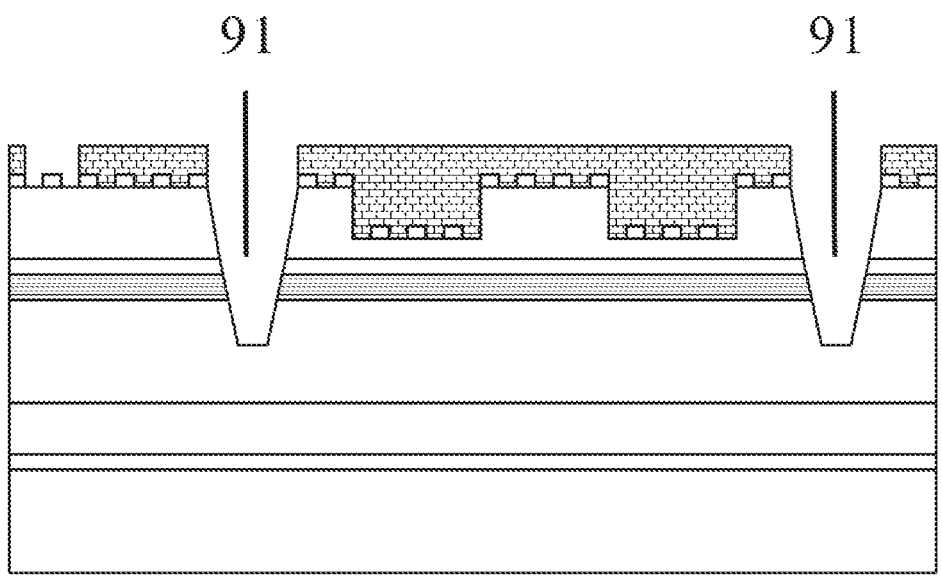
FIG. 4E is a schematic diagram of an n-electrode step manufactured in Embodiment 4.
Figure 4F:
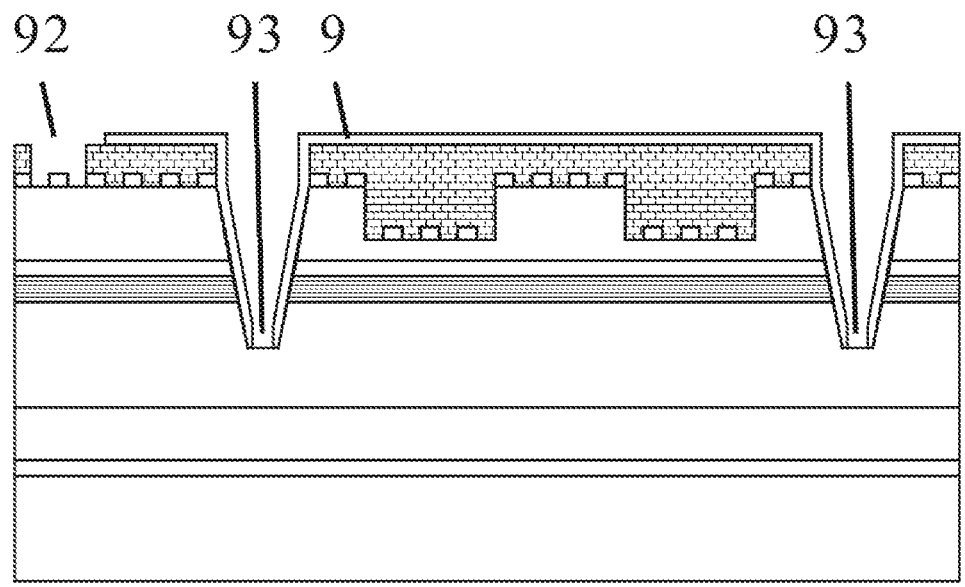
FIG. 4F is a schematic diagram of a passivation layer manufactured in Embodiment 4.
Figure 4G:
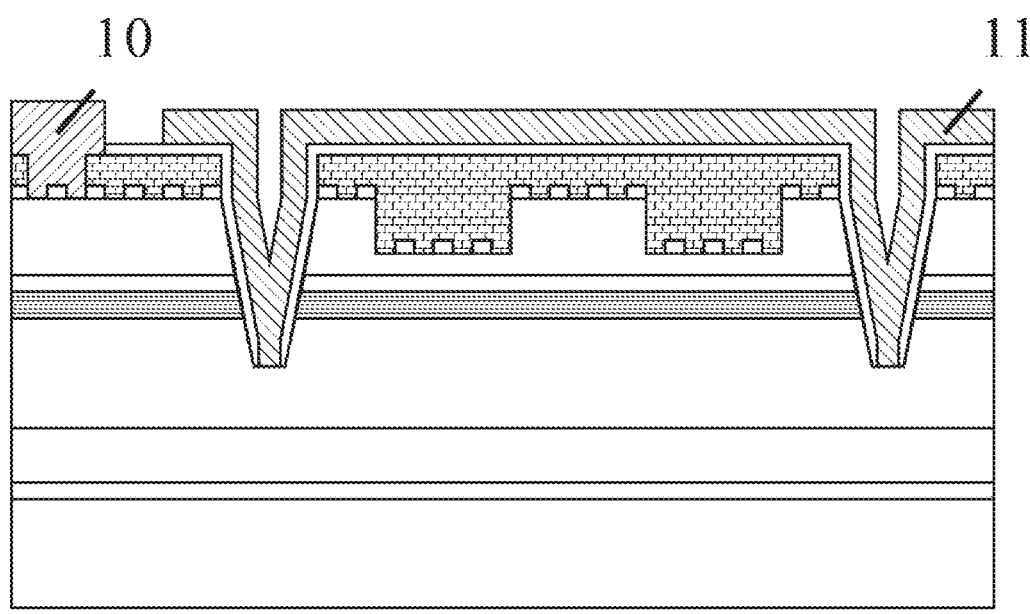
FIG. 4G is a schematic diagram of a p-electrode layer and an n-electrode layer manufactured in Embodiment 4.

An efficient wide bandgap GaN-based LED chip based on a SP effect is shown in FIG. 4G.

A micro-nano composite structure is manufactured on a surface of a p-GaN in a LED chip of a flip-chip structure. A micro structure is a hexagonal prism frustum hole with tetragonal lattice distribution, wherein the hexagonal prism frustum hole has a lattice constant of 6 µm, an uppper bottom side length of 2.5 µm and a lower bottom side length of 2.2 µm, and a distance from the lower bottom to a top of a QW is 50 nm. A nano structure refers to tightly arranged single-layer $SiO_2$ tiny spheres distributed on the entire surface of the p-GaN, and a diameter of the tiny sphere is 300 nm. A metallic reflecting mirror layer is manufactured on the $SiO_2$ tiny sphere to form a micro-nano composite metal structure.

A manufacturing process of the efficient wide bandgap GaN-based LED chip based on a SP effect is shown in FIG. 4A to FIG. 4G, and the manufacturing steps are as follows.

(1) A buffer layer 2, an unintentionally doped GaN layer 3, an n-GaN layer 4, a QW layer 5, an electron blocking layer 6, and a flat p-GaN layer 7 are sequentially manufactured on a substrate 1 layer by layer. An ordinary ultraviolet photoetching technology is used to manufacture a hexagonal prism frustum hole with tetragonal lattice distribution on a photoresist, i.e., a mask structure in microscale 72, wherein the hexagonal prism frustum hole has a lattice constant of 6 µm and a side length of 2.2 µm, as shown in FIG. 4A.

(2) An ICP etching technology is used to manufacture a hexagonal prism frustum hole with tetragonal lattice distribution on the surface of the p-GaN layer 7 by using a photoresist as a mask, wherein the prism frustum hole has a lattice constant of 6 µm, an upper bottom side length of 2.5 µm and a lower bottom side length of 2.2 µm. A distance from the bottom to a top of a QW is 50 nm. A p-GaN layer 74 having a micron size structure is manufactured, as shown in FIG. 4B.

(3) $SiO_2$ tiny spheres with a diameter of 450 nm are added into absolute ethyl alcohol to prepare a tiny-sphere solution with a mass fraction of 2.5%, and the tiny spheres are uniformly dispersed by ultrasonic vibration for 30 minutes in the solution.

(4) Deionized water is added into a container, and after a liquid level is calm, the tiny-sphere solution is sucked and slowly dropwise added along an inner wall of the container, so that the tiny spheres are completely diffused on the liquid level.

(5) 2% sodium dodecyl sulfate solution is dropwise added at an appropriate position of the liquid level to reduce a surface tension of a water surface, so that the $SiO_2$ tiny spheres form a single-layer compact tiny-sphere film stably floating on the liquid level.

(6) The substrate is immersed into the liquid level, slowly moved towards the tiny-sphere film after being contacted with the tiny-sphere film, and pulled upwardly at an angle of 45 degrees, so that the tiny-sphere film is transferred to the substrate from the liquid level.

(7) The substrate is stood for 2 hours to completely evaporate the solvent, and single-layer closely arranged $SiO_2$ tiny spheres are formed on the surface of the p-GaN layer 7.

RIE etching is performed using $CHF_3$ and $SF_6$ gas to reduce a lateral dimension of the $SiO_2$ tiny spheres to 300 nm, and form $SiO_2$ tiny spheres with triangular lattice distribution on the surface of the p-GaN layer, i.e., a mask structure in nanoscale 70, wherein the $SiO_2$ tiny spheres have a lattice constant of 450 nm and a width of 300 nm, as shown in FIG. 4C.

(9) A Cr/Al/Cr (0.5 nm/200 nm/50 nm) metallic reflecting mirror layer 8 is manufactured by using a metal lift-off technology and an electron beam evaporation technology. A micro-nano composite metal structure is formed on an interface of the metallic reflecting mirror layer 8 and the p-GaN layer 7, p-electrode metal holes 81 and n-electrode metal holes 82 are distributed in the metallic reflecting mirror layer 8, and a distance from a bottom of the nano metal structure to the top of the QW is 50 nm, which is as shown in FIG. 4D.

(10) An ordinary ultraviolet photolithography technology and an ICP etching technology are used to form an n-electrode step 91 at the n-electrode metal holes 82, and the n-electrode step 91 extends to the n-GaN layer 4, as shown in FIG. 4E.

(11) A SiN passivation layer 9 is manufactured on the surface of the metallic reflecting mirror layer 8 by using a PECVD, an ordinary ultraviolet photolithography technology and a reactive ion etching (RIE) technology, and p-electrode holes 92 and n-electrode holes 93 are distributed in the passivation layer 9, as shown in FIG. 4F.

(12) A Cr/Au (50 nm/500 nm) p-electrode layer 10 and a Cr/Au (50 nm/500 nm) n-electrode layer 11 are manufactured on the surface of the passivation layer 9 using a metal lift-off technology and an electron beam evaporation technology, as shown in FIG. 4G.

(12) A Cr/Au (50 nm/500 nm) p-electrode layer 10 and a Cr/Au (50 nm/500 nm) n-electrode layer 11 are manufactured on the surface of the passivation layer 9 using a metal lift-off technology and an electron beam evaporation technology, as shown in FIG. 4-7.

The efficient wide bandgap GaN-based LED chip based on a SP effect is obtained, which generates a local SP with higher efficiency and results in small SP losses. Compared with a GaN-based LED chip without a micro-nano composite structure, the luminous efficiency is improved by 50%, and the modulation bandwidth is improved by 75%.

What is claimed is:

1. An efficient wide bandgap GaN-based LED chip based on a surface plasmon effect, the broadband efficient GaN-based LED chip is of a flip-chip structure, comprising from bottom to top in sequence, a substrate, a buffer layer, an unintentionally doped GaN layer, an n-GaN layer, a quantum well layer, an electron blocking layer, a p-GaN layer, a metallic reflecting mirror layer, a passivation layer, a p-electrode layer, and an n-electrode layer; and a position of a bottom surface of the metallic reflecting mirror layer contacted to a surface of the p-GaN layer is provided with a micro-nano composite metal structure, wherein the micro-nano composite metal structure comprises a micro metal structure and a nano metal structure; both the micro metal structure and the nano metal structure are structures with alternating protrusion and recess, and the nano metal structure is distributed on an interface of the micro metal structure and the p-GaN layer; the surface of the p-GaN layer is provided with a micro-nano composite structure complementary to the micro-nano composite metal structure; and protrusion portions of the micro metal structure extend to a position 10 nm to 1 µm from a bottom of the p-GaN layer and close to the quantum well layer, and recess portions of the micro metal structure cover the surface of the p-GaN layer.

2. The efficient wide bandgap GaN-based LED chip based on a surface plasmon effect according to claim 1, wherein the protrusion and recess portions of the micro metal structure are distributed in space in one manner of random distribution, one-dimensional grating distribution, and two-dimensional lattice distribution, and a shape of the protrusion and an inner concave shape of the recess are both one of a cuboid, a cylinder, a truncated cone, a prism and a prism frustum; and protrusion and recess portions of the nano metal structure are distributed in space in one manner of random distribution, one-dimensional grating distribution, and two-dimensional lattice distribution, and a shape of the protrusion and an inner concave shape of the recess are both one of an irregular shape, a cuboid, a cylinder, a truncated cone, a prism and a prism frustum.

3. The efficient wide bandgap GaN-based LED chip based on a surface plasmon effect according to claim 1, wherein both an outer diameter and a height of the protrusion and an inner diameter and a depth of the recess of the micro metal structure are greater than a propagation length of a surface plasmon, ranging from 50 nm to 5 µm; and a distance between the nano metal structure on the protrusion portion of the micro metal structure and the quantum well layer is smaller than a penetration depth of the surface plasmon in a chip medium, ranging from 10 nm to 200 nm.

4. A manufacturing method for the efficient wide bandgap GaN-based LED chip based on a surface plasmon effect according to claim 1, comprising the following steps of:
   (1) sequentially manufacturing the buffer layer, the unintentionally doped GaN layer, the n-GaN layer, the quantum well layer, the electron blocking layer, and a flat p-GaN layer on the substrate layer by layer; and manufacturing a mask structure in nanoscale on the surface of the flat p-GaN layer;
   (2) copying a nano size pattern of the mask structure in nanoscale to the surface of the flat p-GaN layer by etching to manufacture the p-GaN layer having a nano size structure, and removing remaining mask materials of the remaining mask structure in nanoscale;
   (3) manufacturing a mask structure in microscale on the surface of the p-GaN layer having a nano size structure;
   (4) copying a micron size pattern of the mask structure in microscale to the p-GaN layer having a nano size structure by etching to manufacture the p-GaN layer with the micro-nano composite structure distributed on the whole surface thereof, and removing remaining mask materials of the remaining mask structure in microscale;
   (5) manufacturing the metallic reflecting mirror layer on the surface of the p-GaN layer distributed with the micro-nano composite structure, and distributing a p-electrode metal hole and an n-electrode metal hole in the metallic reflecting mirror layer;
   (6) extending to the n-GaN layer through etching at the n-electrode metal hole to form an n-electrode step;
   (7) manufacturing the passivation layer on a surface of the metallic reflecting mirror layer, and distributing a p-electrode dielectric hole and an n-electrode dielectric hole in the passivation layer; and
   (8) manufacturing the p-electrode layer and the n-electrode layer on a surface of the passivation layer.

5. The manufacturing method for the efficient wide bandgap GaN-based LED chip based on a surface plasmon effect according to claim 4, wherein in the steps (1), (2), (3) and (4), after manufacturing the mask structure in nanoscale on the surface of the flat p-GaN layer, the mask structure in microscale is directly manufactured on the surface of the mask structure in nanoscale, the p-GaN layer having a micro-nano composite structure is manufactured by one-time etching, and a protrusion surface of the p-GaN layer having a micro-nano composite structure does not have a nano structure thereon.

6. The manufacturing method for the broadband efficient wide bandgap GaN-based LED chip based on a surface plasmon effect according to claim 4, wherein in the steps (1), (2), (3) and (4), the p-GaN layer having a micron size structure is firstly manufactured on the surface of the flat p-GaN layer by etching the mask structure in microscale; and then the p-GaN layer having a micro-nano composite structure distributed on the whole surface thereof is manufactured by etching the mask structure in nanoscale on the surface of the p-GaN layer having a micron size structure.

7. The manufacturing method for the broadband efficient wide bandgap GaN-based LED chip based on a surface plasmon effect according to claim 4, wherein in the steps (1), (2), (3) and (4), the p-GaN layer having a micron size structure is firstly manufactured on the surface of the flat p-GaN layer by etching the mask structure in microscale; and then the mask structure in nanoscale is manufactured on the surface of the p-GaN layer having a micron size structure, and the metallic reflecting mirror layer is directly manufactured on the surface of the mask structure in nanoscale.

8. The manufacturing method according to claim 4, wherein the manufacturing of the mask structure in nanoscale comprises the following steps of:
   (1) manufacturing a thin film on the surface of the p-GaN layer, a material of the thin film being one of $SiO_2$, SiN, $Al_2O_3$ or metal; and
   (2) sequentially using a photolithography technology and a dry etching technology to manufacture a pattern in nanoscale on the thin film to obtain the mask structure in nanoscale;
   wherein the photolithography technology comprising one of a projection photolithography technology, a deep-ultraviolet photolithography technology, a laser interference photolithography technology, a nanoimprint lithography and an electron beam lithography; and the dry etching technology comprising one of reactive ion etching, inductively coupled plasma etching or focused ion beam etching.

9. The manufacturing method according to claim 4, wherein the manufacturing of the mask structure in nanoscale comprises the following steps of:
   (1) adding tiny spheres in nanoscale into a solvent to prepare a tiny-sphere solution with a mass fraction of 0.5% to 10%, and uniformly dispersing the tiny spheres in the solution, the tiny spheres being one of poly (propyl ethylene), $SiO_2$, $Al_2O_3$, metal or metal/$SiO_2$ core-shell particle, the solvent being one of deionized water, absolute ethyl alcohol or iso-propanol, and the dispersing method being one of ultrasonic vibration or magnetic stirring;
   (2) slowly dropwise adding the tiny-sphere solution into the deionized water with a calm liquid level along an inner wall of a container to completely diffuse the tiny spheres on the liquid level; and dropwise adding a surfactant on the liquid level, so that the tiny spheres form a single-layer compact tiny-sphere film stably floating on the liquid level, the surfactant being one of a sodium dodecyl sulfate solution, a sodium dodecylbenzene sulfonate solution, a sodium dioctylsulfosuccinate solution, a sodium glycocholate solution or a triethanolamine soap solution with a mass fraction of 0.5% to 10%; and
   (3) dipping the flat p-GaN layer or the p-GaN layer having a micron size structure into the liquid level, which is slowly moved towards the tiny-sphere film after being contacted with the tiny-sphere film, and pulled upwardly at an angle of 30° to 60°, so that the tiny-sphere film is transferred from the liquid level to the surface of the flat p-GaN layer or the surface of the p-GaN layer having a micron size structure, and then the solvent is completely volatilized by standing.

* * * * *